United States Patent [19]

Smith

[11] Patent Number: 5,321,372

[45] Date of Patent: Jun. 14, 1994

[54] APPARATUS AND METHOD FOR TERMINATING CABLES TO MINIMIZE EMISSIONS AND SUSCEPTIBILITY

[75] Inventor: Robert W. Smith, Los Altos, Calif.

[73] Assignee: SynOptics Communications, Inc., Santa Clara, Calif.

[21] Appl. No.: 1,809

[22] Filed: Jan. 8, 1993

[51] Int. Cl.$^5$ ............................................. H03H 7/00
[52] U.S. Cl. .................................... 333/1; 333/12; 333/22 R; 174/34; 379/416
[58] Field of Search .................... 333/1, 12, 22 R; 307/89-91; 174/32-34, 36; 379/398, 416

[56] References Cited

U.S. PATENT DOCUMENTS

| | | | |
|---|---|---|---|
| 1,998,960 | 4/1935 | Kaar . | |
| 2,026,308 | 12/1935 | Ganz . | |
| 2,222,406 | 11/1940 | Crossley . | |
| 2,280,950 | 4/1942 | Harder . | |
| 3,705,365 | 12/1972 | Szabo et al. | 333/12 |
| 3,731,234 | 5/1973 | Collins | 333/1 |
| 4,056,790 | 11/1977 | Pospischil et al. | 333/5 |
| 4,697,051 | 9/1987 | Beggs et al. | 178/63 D |
| 4,751,607 | 6/1988 | Smith | 361/119 |
| 4,755,629 | 7/1988 | Beggs et al. | 174/34 |
| 4,823,095 | 4/1989 | Afallah et al. | 333/22 R |
| 4,860,343 | 8/1989 | Zetena, Jr. | 379/110 |
| 4,873,393 | 10/1989 | Friesen et al. | 174/34 |
| 5,027,088 | 6/1991 | Shimizu et al. | 333/1 |
| 5,113,159 | 5/1992 | Adriaensens et al. | 333/12 |

FOREIGN PATENT DOCUMENTS

| | | | |
|---|---|---|---|
| 714544 | 12/1941 | Fed. Rep. of Germany | 333/1 |
| 79551 | 6/1981 | Japan | 333/22 R |

*Primary Examiner*—Paul Gensler
*Attorney, Agent, or Firm*—Blakely, Sokoloff, Taylor & Zafman

[57] ABSTRACT

In a computer network having a cable for transmission of electrical signals between data terminal equipment and a device used to control and route data in the network, an apparatus for terminating the cable to minimize emissions radiating from the cable and susceptibility of the cable to outside interferences. The cable is comprised of unshielded twisted pairs of wires. Each twisted pair is individually terminated into a matching input impedance. The difference signals being conducted in each twisted pair produces common mode currents which sets up standing waves through the cable. Consequently, at each end of the cable, the common mode of the twisted pairs is terminated into a load having an impedance approximately equal to the common mode impedance of the twisted pairs. These loads effectively dissipate the energy from the standing waves, thereby minimizing emissions. Reciprocally, susceptibility is likewise minimized.

17 Claims, 3 Drawing Sheets

APPARATUS AND METHOD FOR TERMINATING CABLES TO MINIMIZE EMISSIONS AND SUSCEPTIBILITY

FIELD OF THE INVENTION

The present invention relates to the field of transmission lines. More particularly, the present invention pertains to an apparatus and method for terminating twisted pair cables to minimize emissions and susceptibility.

BACKGROUND OF THE INVENTION

In the field of computer systems, computer networks have enjoyed increasing popularity because of their versatility, flexibility, and economy. In contrast to powerful, centralized and costly "mainframes," wherein processing is routed to and performed by the mainframe computer, a computer network typically distributes processing to various autonomous computers. These individual computers are coupled together so that each computer in the network can communicate with other computers connected to the network. This arrangement allows end users to work on a joint project on separate computers by sharing files and swapping information over the network. Furthermore, application programs, databases, and peripheral hardware such as printers, disk drives, etc., can be shared amongst the various end users. Thereby, information and computing resources can readily be pooled amongst individuals and work groups. In addition, reliability is improved because a breakdown of one computer on the network does not result in shutting down or crashing the entire computer network. The other parts of the computer network can continue to function while the particular failed component is being repaired. Moreover, it is a relatively simple procedure to upgrade an existing computer network by hooking up additional computers and network control equipment on an as-needed basis.

Typically, a computer network is comprised of a number of data terminal equipment (DTE) which are coupled together by transmission lines. DTEs include personal computers, workstations, an input terminal, etc. Each DTE has a transceiver which couples the DTE to the transmission line. The transceiver transmits data onto and receives data from the transmission lines as well as performing any necessary signal conversions. Numerous transmission lines conduct digital bits of data between the DTEs. Often, the transmission lines are connected to a hub or concentrator which is used to route and manage signal traffic on the network. To expand a computer network, repeaters are used to copy and forward bits of data from one network to another; bridges are implemented to interface networks having different protocols; and routers are used for efficiently directing data packets to their final destination.

Presently, there exists many different types of media which can be used for propagating the transmission of data between the various devices of a computer network. The different types of media include unshielded twisted pair wiring, shielded twisted pair wiring, coaxial cables, and fiber optic cables. Traditionally, electrical communications were conducted over two insulated copper wires twisted together, hence the term twisted pair wiring. However, twisted pair wiring is susceptible to outside interference which introduces distortions. The distortions caused by outside sources increase with longer distances and higher data rates. These distortions can lead to signal errors. Also, signals being conducted on these twisted pairs suffer from attenuation.

Increasing the signal strength addresses both these issues, but it also produces higher levels of emissions from the twisted pair wires. Government regulations mandate that emissions be limited to a particular level in order to minimize interferences with other apparatus. Thus, the signal strength for twisted pairs is governed by the standards set forth by the FCC. Sometimes, a shielding made of wire mesh or foil having a high permeability is used to surround the twisted pair wiring. One such implementation wherein four twisted shielded pairs for conducting differential signals, a 12 volt power line, and a master shielding and insulation layer encompassing all the wires is known as an Attachment Unit Interface (AUI) cable. For broadband and many baseband systems, an alternative to twisted pairs is coaxial cables. Coaxial cables have a single center conductor surrounded by an insulator, which is then enclosed by a metal shield such as a wire mesh or foil. Coaxial cables can handle greater bandwidths and are less susceptible to outside noise. However, coaxial cables are typically more expensive than twisted pairs.

Fiber optic cables are also being implemented in computer networks. Fiber optic cables are generally immune to electrical noise and are capable of handling very high bandwidth and transmission speed. However, splicing and tapping fiber optic cables is an expensive and difficult process. Moreover, fiber optic cables are very expensive. Hence, fiber optic cables are typically applied for long distances and heavy traffic.

Choosing among these various different media is a matter of tradeoffs. For most small local area networks (LANs), cost is of paramount concern. Significant costs are incurred not only for purchasing the medium itself but also for physically routing the medium to each of the various terminals. Costs could be greatly reduced if the network could take advantage of an already existing medium. One such medium is the telephone lines already existing and installed in virtually all office buildings, factories, and homes. These same telephone lines comprising twisted pair wiring can be used to conduct digital signals for computers rather than analog signals for phone systems. The disadvantage with using telephone wiring is that they are limited to short run lengths because of the susceptibility and emissions problems inherent to all twisted pair wiring. In some cases, longer lengths are required than can be met by telephone lines. Consequently, more expensive medium have to be bought and installed in these circumstances.

Therefore, there is a need in the prior art for an apparatus and method for minimizing the susceptibility and emissions of twisted pair wiring in order that longer lengths can be implemented to conduct digital signals in a computer network. It would also be highly preferable for the apparatus and method to be inexpensive and easy to implement.

SUMMARY OF THE INVENTION

In response to the shortcomings associated with prior art twisted pair cables used in the transmission of digital signals in a computer network, the present invention minimizes emissions radiating from such a cable and the susceptibility of signals on the cable to outside interferences. This is accomplished by terminating each twisted pair into a matching input impedance of either a data terminal equipment, such as a personal computer, or a device used to control and route data through the computer network.

The difference signals being conducted in each twisted pair produces common mode currents. In turn, these common mode currents generate standing waves through the cable. If left unterminated, the energy from the standing waves radiate to the surroundings. Consequently, the present invention terminates the common mode of the twisted pairs into a load having an impedance approximately equal to the common mode impedance of the twisted pairs. The cable is so terminated at both ends. These loads effectively dissipate the energy from the standing waves, thereby minimizing emissions. Reciprocally, susceptibility is also minimized.

In the currently preferred embodiment of the present invention, resistors are used as loads. The common mode impedance of the twisted pairs are measured, and an equivalent resistor value is implemented. Transformers are coupled across the individual twisted pairs. The resistors are coupled to the center taps of the transformers. This arrangement minimizes the impact of the common mode loads on the difference signals being transmitted on the twisted pairs while effectively providing a common mode termination. As a result, the energy associated with the standing waves is dissipated in the form of heat in the resistors rather than as RF energy to its surroundings.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

An apparatus and method for minimizing susceptibility and emissions in twisted pair wiring is described. In the following description, for purposes of explanation, numerous specific details are set forth, such as resistor values, transformer types, cable classifications, network components, etc., in order to provide a thorough understanding of the present invention. It will be obvious, however, to one skilled in the art that these specific details need not be used to practice the present invention. In other instances, well-known structures and circuits have not been shown in detail in order to avoid unnecessarily obscuring the present invention.

Figure 1:
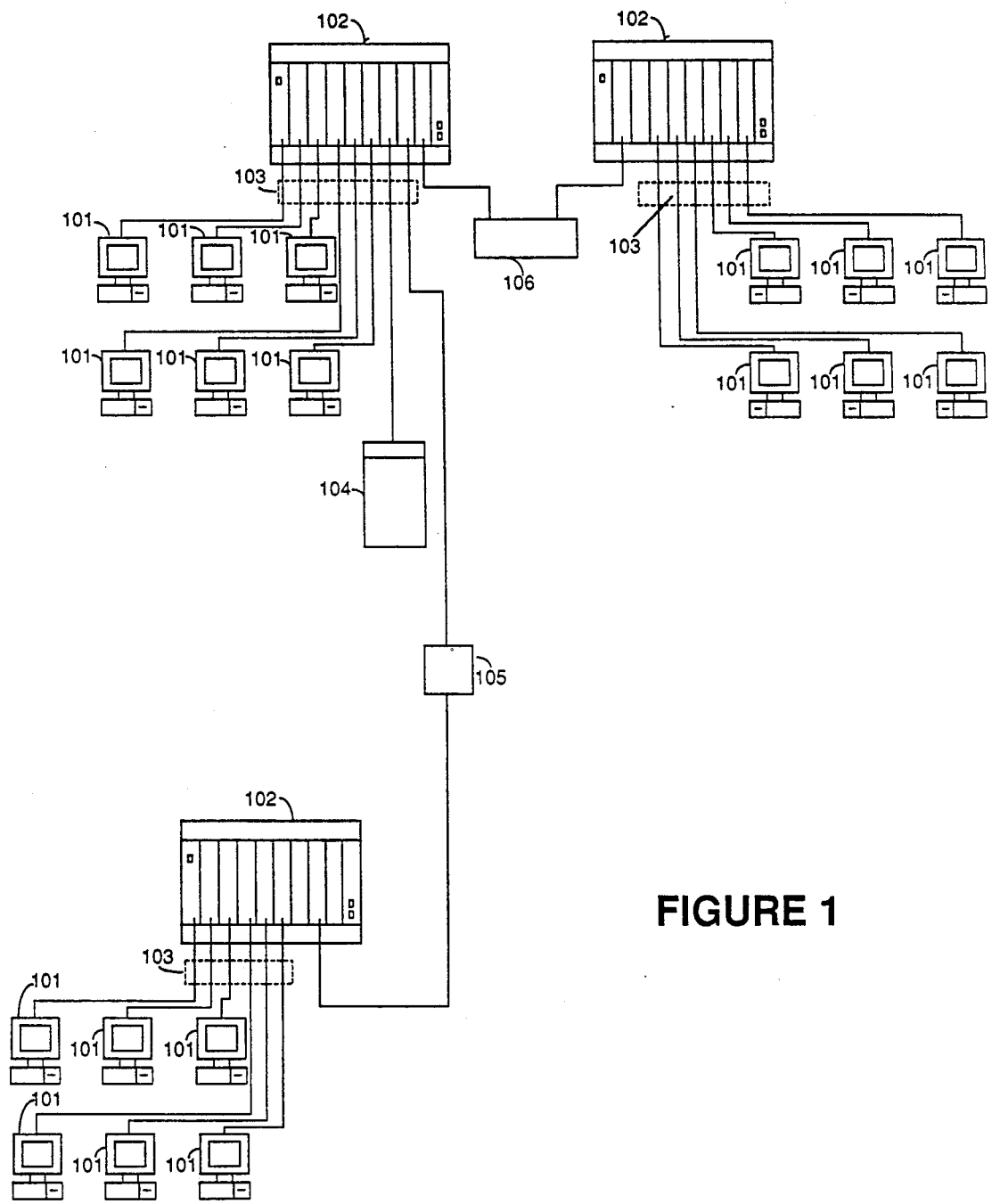
FIG. 1 illustrates a computer network which the present invention may be practiced upon.

Referring to FIG. 1, a typical computer network system upon which the present invention may be utilized is shown. A number of users access the computer network through data terminal equipment (DTE) 101. DTE 101 can include personal computers, workstations, portable computers, minicomputers, dumb terminals, etc. DTE 101 are coupled to concentrators 102 by unshielded twisted pair cables 103. Additionally, a file server 104 can be coupled to a concentrator 102 so that users can share stored files, data bases, and application programs. Concentrators 102 act as focal points for managing and routing network data communications. Concentrators 102 can be coupled together. A repeater 105 can be used to amplify attenuated signals. A bridge 106 can be used to couple together two concentrators which service network segments having different protocols (e.g., an Ethernet-to-Token Ring bridge). Bridge 106 listens to data transmissions, examines each data packet's destination, makes any necessary conversions, and discriminately forwards each data packet. Sometimes a network management station (not shown) is used to collect, monitor, display, and control various aspects of the computer network.

The computer network of FIG. 1 can be expanded to encompass hundreds of users by adding extra DTEs, concentrators, repeaters, and bridges. Furthermore, a router can be used to interface networks having different network layers such as Token Bus versus X.25. In addition, various parts of the computer network can be configured any number of different topologies (e.g., star, ring, tree, et.) and different protocols such as Ethernet, token ring, token bus, etc. can be utilized. It should be noted that the present invention applies to any type of computer network configuration, regardless of size and make, which utilizes twisted pair wires for data communications.

Figure 2:
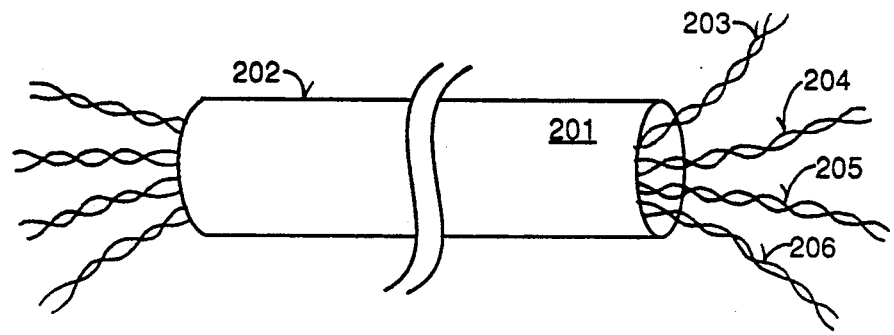
FIG. 2 shows an unshielded twisted pair cable.

FIG. 2 shows a typical unshielded twisted pair cable 201. Cable 201 comprises an outer plastic sheath 202, and four pairs of insulated copper wires 203–206. Each pair is capable of conducting a differential electrical signal. In a differential signal scheme, the data is independent of the individual signal levels. Instead, information is conveyed as the difference of the voltage levels being conducted between the two wires. A differential amplifier is used to amplify the received difference voltage between the signals on the two wires. When the signals on the two wires both change levels together, it is referred to as common-mode change. A differential change is known as normal mode. A differential amplifier having a high common-mode rejection ratio (i.e., the ratio of response for a normal-mode signal to the response for a common-mode signal of the same amplitude) are used in those situations wherein weak signals are susceptible to noise and crosstalk.

One end of the twisted pair wires is coupled to a DTE, while the other end is coupled to a concentrator or some other equivalent control/routing mechanism. Typically, two twisted pairs are used for providing communication between a DTE and a concentrator. One twisted pair is used to transmit digital data. The second twisted pair is used to receive digital data. In order to reduce susceptibility and emissions, these signals are terminated into matched loads. It is highly desirable to match the load to the characteristic impedance of the twisted pair because for high frequency and short rise-time signals, a transmission line terminated with a load equal to its characteristic impedance transfers the electrical signal without reflection. In so doing, all the power in the signal is transferred to the load. Furthermore, the impedance looking into such a terminated line is equivalent to its characteristic impedance, irregardless of its frequency. In one example, both the DTE and the concentrator have 100 ohm input impedances. Terminating each twisted pair thusly, aids in reducing the problems of susceptibility and emissions.

However, it has been discovered in the present invention that imbalances between adjacent twisted pairs of wires running the length of an unshielded twisted pair cable causes common-mode currents to be transferred from the differential currents in each twisted pair arising from the signals being conducted. This common-mode coupling effect results in standing waves in the longitudinal mode. A standing wave is defined in which for any component of the field, the ratio of its instantaneous value at one point to that at any other point does not vary over time. This resulting standing wave is longitudinal in that the direction of its displacement at each point of the twisted pair is the same as the direction of the propagation. In the prior art. The energy of these standing waves are dissipated by emanating from the unshielded twisted pair cable. In other words, the unshielded twisted cable forms a common-mode radiator.

In the present invention, this common-mode effect is minimized by terminating the common-mode of the differential twisted pairs into balanced loads. In the currently preferred embodiment of the present invention, this is accomplished by determining the impedance between the twisted pairs. An impedance meter can be used to measure this common-mode impedance. For a standard Category Five unshielded twisted pair cable, the common-mode impedance is approximately 145 ohms. By terminating the two common-mode differential pairs of an unshielded twisted pair cable into 145 ohm loads, the standing waves are absorbed by the loads. The end result is a flat cable with minimal standing waves and greatly minimized emissions from the common-mode radiator.

In summary, the energy in the standing waves is dissipated in the form of heat in the loads rather than radio frequency (RF) energy to it's surroundings. According to the reciprocity theorem, if an electromagnetic force at one point in a network produces a current at a second point in the network, then the same voltage acting at the second point will produce the same current at the first point. Consequently, applied to the instant case, the amount of susceptibility to interfering external electromagnetic fields should, likewise, be minimized by the same amount as the reduction in emissions produced by the present invention.

Figure 3:
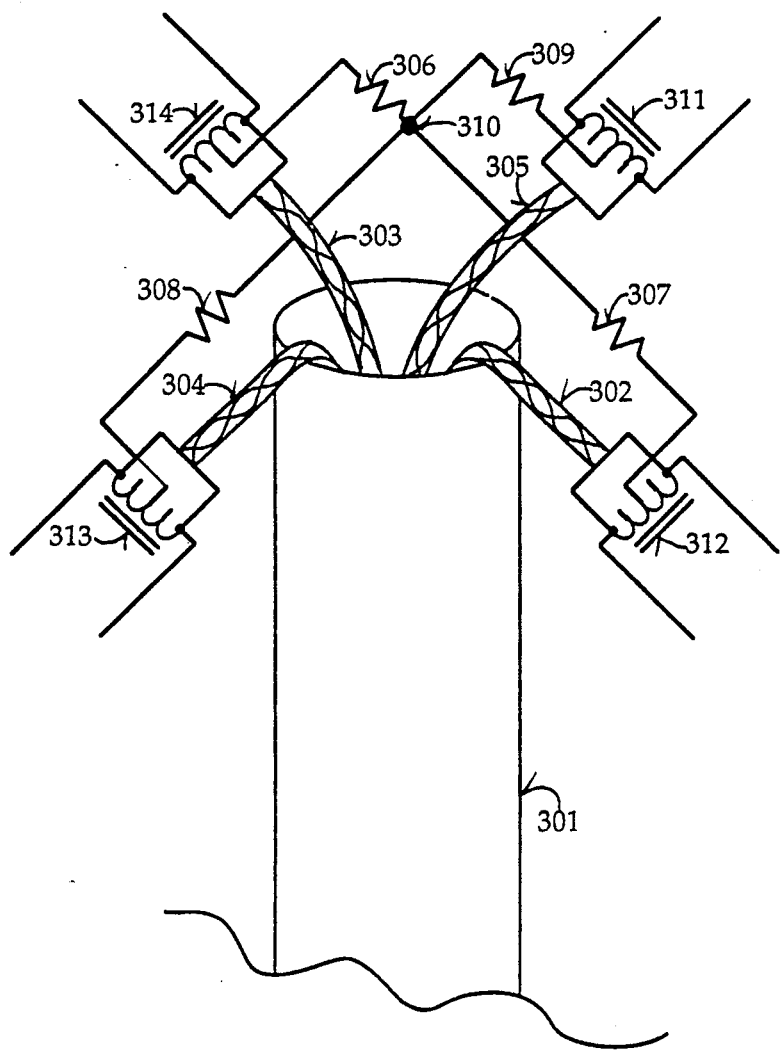
FIG. 3 shows the currently preferred embodiment of the present invention as applied to an unshielded cable having four twisted pair wires.

In the currently preferred embodiment of the present invention, a combination of transformers and resistors are implemented as loads for terminating the common-mode differential pairs as shown in FIG. 3. An unshielded twisted pair cable 301 having four twisted pairs of wires 302-305 is shown. Each of the twisted pairs is terminated into an input impedance of 100 ohms to match their characteristic impedance. In addition, according to the present invention, four 75 ohm resistors 306-309 are used as loads for terminating the common-mode differential pairs. It should be noted that the resistance being implemented depends on the common-mode impedance of that particular type of cable.

Resistor 306 is coupled at one end to the center tap of transformer 314. The windings of transformer 314 are coupled to twisted pair 303. The other end of resistor 306 is coupled to node 310. Resistor 307 is coupled at one end to the center tap of transformer 312. The windings of transformer 312 are coupled to the twisted pair 302. The other end of resistor 307 is coupled to node 310. Likewise, one end of resistor 308 is coupled to the center tap of transformer 313. The windings of transformer 313 are coupled to the twisted pair 304. The other end of resistor 308 is coupled to node 310. Resistor 309 is coupled at one end to the center tap of transformer 311. The windings of transformer 311 are coupled to the twisted pair 305. The other end of resistor 309 is coupled to node 310. Thus, all four resistors 306-309 are coupled at one point, node 310. Note that node 310 could be, but does not necessarily have to be grounded. Transformers 311-314 are 1:1 center tap transformers. This same transformer and resistor arrangement is implemented for the other end of cable 301 as well.

The twisted pairs from the transformers 311-314 are coupled to the DTE/concentrator. By implementing the transformer and resistor arrangement, the energy in the standing waves caused by the common-mode currents are dissipated in the 75 ohm resistors 306-309, with negligible or no impact on the data being transmitted through the individual twisted pairs 302-305.

In an alternative embodiment, chokes can be used instead of resistors. In other embodiments, equivalent circuits can be implemented as loads so long as they have an impedance approximately matching that of the common-mode impedance. For example, two 145 $\Omega$ resistors can be substituted for the four 75 $\Omega$ resistors. One of these resistors is coupled across the center taps of transformers 312 and 314, while the other resistor is coupled across the center taps of transformers 311 and 313.

Figure 4:
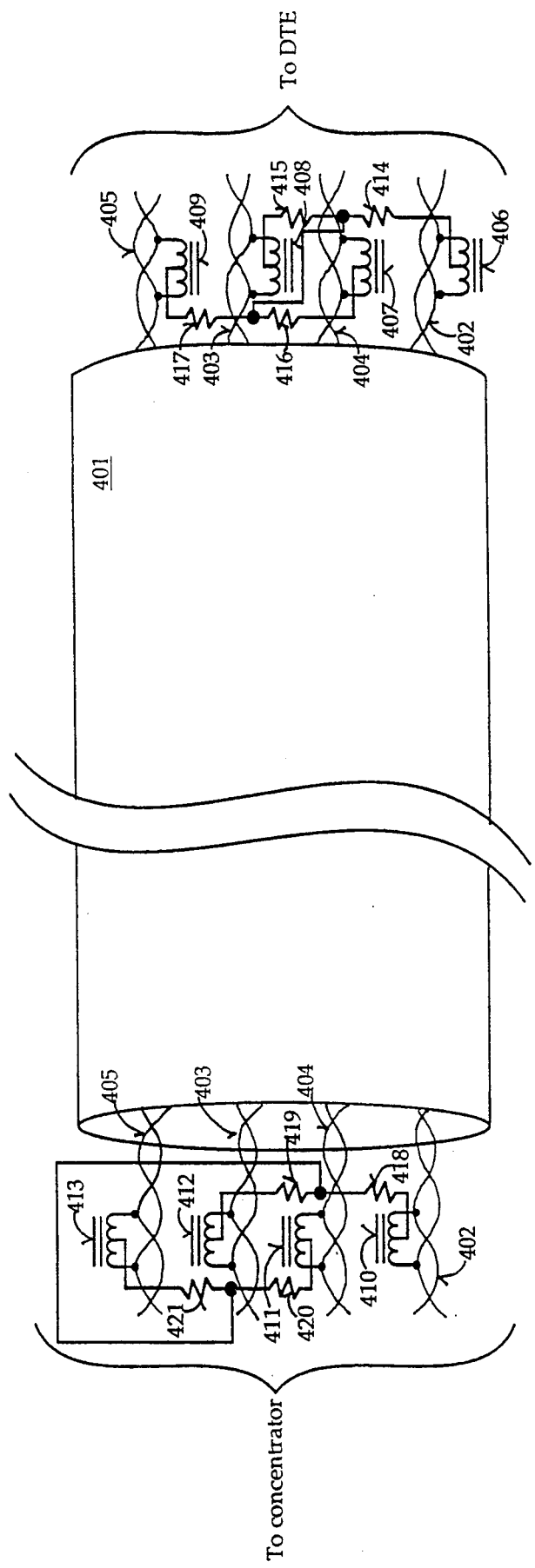
FIG. 4 shows another view of the currently preferred embodiment of the present invention as applied to an unshielded twisted pair cable.

FIG. 4 is another illustration of the currently preferred embodiment of the present invention. One end of the unshielded twisted pair cable 401 is coupled to a DTE, such as to the input filter or transceiver of a personal computer. The other end of cable 401 is coupled to a concentrator or its like. Cable 401 is comprised of four twisted pair wires 402-405. It can be seen that the transformer and resistor circuit is implemented at both ends of cable 401. Transformers 406-413 in combination with resistors 414-421 effectively absorb the standing waves produced by the common-mode currents of twisted pairs 402-405. Implementing such a transformer and resistor combination can result in upwards of approximately 10 dB improvement in emissions and susceptibility.

Although the above description was in relation to an unshielded twisted pair cable, the present invention can equally be applied to shielded twisted pair cables. The shielding would further reduce emissions and susceptibility. In addition, the present invention is not limited to cables having four twisted pairs in a quad configuration. The present invention can be applied to any combination of twisted pair wires of two or more. The present invention is equally applicable to twisted pairs running in straight parallel lines as well as twisted pairs which are then twisted amongst themselves, so long as symmetry is maintained. Moreover, the present invention can be practiced upon untwisted wires, such as untwisted telephone wires. Furthermore, terminating the common-mode according to the present invention at just one of the ends of the cable is an improvement over no such terminations at all.

In the currently preferred embodiment of the present invention, the transformers and resistors can be implemented as part of the transceiver found in the DTE and concentrator. Alternatively, the transformers and resistors can be implemented within an external media filter. This filter normally conditions signals prior to transmission on the cable.

Thus, an apparatus and method for minimizing emissions in a twisted pair cable is described.

What is claimed is:

1. A communications system for transmission of an electrical signal having a means for generating said electrical signal, a means for transmitting said electrical signal, a means for receiving a transmitted electrical signal, and a means for conducting said transmitted electrical signal from said generating means to said receiving means, said conducting means comprising:

a first pair of twisted wires for conducting a signal which is terminated into an input impedance matched to said pair of twisted wires;

a second pair of twisted wires for conducting a second signal which is terminated into an input impedance matched to said second pair of wires;

a means for terminating a common mode of said first pair of wires and said second pair of wires into a load having an impedance approximately equal to a common mode impedance of said first pair of wires and said second pair of wires, wherein said common mode of said first pair of wires and said second pair of wires are terminated into a first load at one end of said wires and into a second load at another end of said wires, said first load and said second load comprising resistors wherein susceptibility and emissions of said conducting means are minimized.

2. The communications system of claim 1, wherein said conducting means further comprises:

a first transformer coupled to said first pair of wires;

a second transformer coupled to said second pair of wires, wherein said first load is coupled to a first center tap of said first transformer and a second center tap of said second transformer.

3. The communications system of claim 2, wherein said conducting means further comprises:

a third pair of twisted wires for conducting a third signal which is terminated into an input impedance matched to said third pair of wires;

a fourth pair of twisted wires for conducting a fourth signal which is terminated into an input impedance matched to said fourth pair of wires;

a second means for terminating a common mode of said third pair of wires and said fourth pair of wires into a second load having an impedance approximately equal to a common mode impedance of said third pair of wires and said fourth pair of wires.

4. The communications system of claim 3, wherein said first signal, said second signal, said third signal, and said fourth signal are difference signals.

5. The communications system of claim 4, wherein said first load and said second load reside in said transmitting means and said receiving means.

6. The communications system of claim 5, wherein said first load and said second load reside in a filtering means for conditioning said first signal.

7. The communications system of claim 5, wherein said conducting means further comprises metallic shielding surrounding said first, second, third, and fourth pairs of twisted wires.

8. An apparatus for minimizing susceptibility and emissions of a cable having at least a first insulated conductor, a second insulated conductor, a third insulated conductor, and a fourth insulated conductor for transmission of electrical signals from a source to a destination, wherein said first conductor and said second conductor are terminated with a matching impedance and said third conductor and said fourth conductor are terminated with said matching impedance, said apparatus comprising:

a first load comprising a first resistor coupled to said first, second, third, and fourth conductors for absorbing energy from standing waves produced by common-mode currents induced between said first, second, third, and fourth conductors;

a second load comprising a second resistor placed at an opposing end of said cable, said first load and said second load having an impedance approximately equal to a common mode impedance of said first, second, third, and fourth conductors.

9. The apparatus of claim 8 further comprising:

a first transformer coupled to said first conductor and said second conductor;

a second transformer coupled to said third conductor and said fourth conductor, wherein said first resistor is coupled to a center tap of said first transformer and a center tap of said second transformer.

10. The apparatus of claim 9 further comprising:

a third transformer coupled to said first conductor and said second conductor;

a fourth transformer coupled to said third conductor and said fourth conductor, wherein said second resistor is coupled to a center tap of said third transformer and a center tap of said fourth transformer and wherein said first transformer and said second transformer are placed at said opposing ends of said cable from said third transformer and said fourth transformer.

11. The apparatus of claim 10, wherein said first resistor, said first transformer, and said second transformer reside within said data terminal equipment.

12. The apparatus of claim 10, wherein said first resistor, said first transformer, and said second transformer are placed within an apparatus for filtering said electrical signal.

13. In a computer network having a plurality of digital terminal equipment for providing a plurality of users access to said computer network, a means for controlling data between said digital terminal equipment, and a conductor comprising two pairs of wires for conducting electrical signals between said digital terminal equipment and said controlling means, an apparatus for minimizing emissions from said conductor comprising:

a means for terminating said two pairs of wires at one end to said digital terminal equipment and at the other end to said controlling and routing means, wherein said digital terminal equipment and said controlling and routing means have input impedances approximately equal to a characteristic impedance of said two pairs of wires;

a means for terminating a common mode of said two pairs of wires with a first load comprising a first resistor having an impedance approximately equal to a common mode impedance of said two pairs of wires, wherein common mode energy is dissipated in said load rather than emanating from said conductor;

a means for terminating said common mode with a second load comprising a second resistor also having an impedance approximately equal to said common mode impedance, wherein said loads are disposed near opposing ends of said conductor.

14. The apparatus of claim 13, wherein said conductor further comprises a third pair and a fourth pair of wires for conducting electrical signals between said digital terminal equipment and said controlling means, wherein each pair of wires are coupled to a transformer and a resistor is coupled to a center tap of each transformer, each resistor also being coupled to a common node.

15. The apparatus of claim 14, wherein said resistors are approximately 75 ohms.

16. In a computer network having a plurality of digital terminal equipment for providing a plurality of users access to said computer network, a means for controlling and routing data between said digital terminal equipment, and a conductor comprising at least two pairs of twisted wires for conducting electrical signals between said digital terminal equipment and said controlling and routing means, a method for minimizing emissions from said conductor comprising the steps of:

terminating said two pairs of twisted wires at one end to said digital terminal equipment and at the other end to said controlling and routing means, wherein said digital terminal equipment and said controlling and routing means have input impedances approximately equal to a characteristic impedance of said two pairs of twisted wires;

determining a common mode impedance of said two pairs of twisted wires;

terminating a common mode of said two pairs of twisted wires with a resistive load having an impedance approximately equal to said common mode impedance of said two pairs of twisted wires, wherein common mode energy is dissipated in said resistive load rather than emanating from said conductor;

terminating said common mode with another resistive load also having an impedance approximately equal to said common mode impedance; and disposing said resistive loads near opposing ends of said conductor.

17. The apparatus of claim 16 further comprising the step of implementing transformers for coupling said resistive loads to said pairs of wires to minimize impact on said electrical signals by said loads.

* * * * *